United States Patent
Katscher et al.

(10) Patent No.: US 10,114,090 B2
(45) Date of Patent: Oct. 30, 2018

(54) RF AMPLIFIER CONTROL IN PARALLEL RF TRANSMISSION BASED ON POWER REQUIREMENTS

(71) Applicant: KONINKLIJKE PHILIPS N.V., Eindhoven (NL)

(72) Inventors: Ulrich Katscher, Hamburg (DE); Hanno Heyke Homann, Hamburg (DE); Peter Boernert, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 707 days.

(21) Appl. No.: 14/434,047

(22) PCT Filed: Oct. 1, 2013

(86) PCT No.: PCT/IB2013/059031
§ 371 (c)(1),
(2) Date: Apr. 7, 2015

(87) PCT Pub. No.: WO2014/057391
PCT Pub. Date: Apr. 17, 2014

(65) Prior Publication Data
US 2015/0260808 A1    Sep. 17, 2015

Related U.S. Application Data

(60) Provisional application No. 61/712,917, filed on Oct. 12, 2012.

(51) Int. Cl.
| | |
|---|---|
| *G01V 3/00* | (2006.01) |
| *G01R 33/48* | (2006.01) |
| *G01R 33/36* | (2006.01) |
| *G01R 33/483* | (2006.01) |

(Continued)

(52) U.S. Cl.
CPC ..... *G01R 33/3614* (2013.01); *G01R 33/4833* (2013.01); *G01R 33/4836* (2013.01);
(Continued)

(58) Field of Classification Search
None
See application file for complete search history.

(56) References Cited

U.S. PATENT DOCUMENTS 7,423,430 B1 * 9/2008 Sharif ............. G01R 33/56325
324/309
2008/0211501 A1    9/2008 Graesslin
(Continued)

FOREIGN PATENT DOCUMENTS

| JP | 2008284270 A | 11/2008 |
|---|---|---|
| JP | 2011155461 A | 8/2011 |

(Continued)

OTHER PUBLICATIONS

Katscher, U. et al "Transmit SENSE", Magnetic Rresonance in Medicine, vol. 49, 2003, pp. 144-150.
(Continued)

*Primary Examiner* — Minh N Tang

(57) ABSTRACT

A magnetic resonance imaging system acquires magnetic resonance data from a target volume in a subject. The magnetic resonance imaging system includes multiple excitation sources for generating a slice-selective or slab-selective spatial radio frequency (RF) excitation magnetic field targeting slice/slab spatial variations in the target volume, and a controller coupled to the excitation sources. The controller is adapted for: determining a power level required by the excitation sources for generating the slice-selective/or slab-selective spatial RF excitation magnetic field, decomposing the slice-selective or slab-selective spatial RF excitation magnetic field into respective RF excitation constituents of the excitation sources, controlling each of the excitation sources to simultaneously generate the respective RF excitation constituent, using the determined power level for acquiring the magnetic resonance data.

11 Claims, 7 Drawing Sheets

(51) Int. Cl.
  *G01R 33/561* (2006.01)
  *G01R 33/565* (2006.01)
  *H03F 3/19* (2006.01)
  *G01R 33/58* (2006.01)

(52) U.S. Cl.
  CPC ..... *G01R 33/5612* (2013.01); *G01R 33/5659* (2013.01); *H03F 3/19* (2013.01); *G01R 33/583* (2013.01); *H03F 2200/451* (2013.01)

(56) References Cited

U.S. PATENT DOCUMENTS

| | | | |
|---|---|---|---|
| 2009/0289631 A1 | 11/2009 | Van Den Brink et al. | |
| 2010/0106008 A1 | 4/2010 | Harvey | |
| 2011/0112392 A1* | 5/2011 | Boernert | G01R 33/56375 600/410 |
| 2012/0032677 A1* | 2/2012 | Dannels | G01R 33/5659 324/309 |
| 2012/0256626 A1* | 10/2012 | Adalsteinsson | G01R 33/5612 324/309 |

FOREIGN PATENT DOCUMENTS

| | | |
|---|---|---|
| WO | 2006114749 A1 | 11/2006 |
| WO | 2011033402 A1 | 3/2011 |

OTHER PUBLICATIONS

Katscher, U. et al "Improving Slab Excitation by Parallel Trasmission" Proceedings of the International Society for Magnetic Resonance in Medicine, Apr. 2012, pp. 3458.

Xu, Dan et al "A Noniterative Method to Design Large-Tip-Angle Multidimensional Spatially-Selective Radio Frequency Pulses for Parallel Transmission", Magnetic Resonance in Medicine, vol. 58, No. 2, Aug. 2007, pp. 326-334.

Brunner, David O. et al "Optimal Design of Multiple-Channel RF Pulses under Strict Power and SAR Constraints", Magnetic Resonance in Medicine, vol. 63, No. 5, Apr. 2010, pp. 1280-1291.

Zhu, Yudong et al "System and SAR Characterization in Parallel RF Transmission", Magnetic Resonance in Medicine, vol. 67, No. 5, May 2012, pp. 1367-1378.

Katscher U. et al "Parallel RF Transmission in MRI", NMR in Biomedicine, vol. 19, 2006, pp. 393-400.

Ullmann, Peter et al "Experimental Analysis of Parallel Excitation using Dedicated Coil Setups and Simultaneous RF Transmission on Multiple Channels", Magnetic Resonance in Medicine, vol. 54, 2005, pp. 994-1001.

Boernert, P. et al "SAR Reduction in Parallel Transmission by k-Space Dependent RF Pulse Selection", Proc. International Society for Magnetic Resonance in Medicine, vol. 17, 2009, pp. 2600.

* cited by examiner (a)

(b)

RF AMPLIFIER CONTROL IN PARALLEL RF TRANSMISSION BASED ON POWER REQUIREMENTS

CROSS-REFERENCE TO PRIOR APPLICATIONS

This application is the U.S. National Phase application under 35 U.S.C. § 371 of International Application No. PCT/IB2013/059031, filed on Oct. 1, 2013, which claims the benefit of U.S. Provisional Patent Application No. 61/712,917, filed on Oct. 12, 2012. These applications are hereby incorporated by reference herein.

TECHNICAL FIELD

The invention relates to magnetic resonance imaging, in particular to power supplies for radio frequency (RF) transmit coils of magnetic resonance imaging systems.

BACKGROUND OF THE INVENTION

Transmit SENSE (U. Katscher et al., MRM 49 (2003) 144-150) utilizes the individual shaping of RF waveforms on independent RF transmit channels. The resulting degrees of freedom are used to improve multi-dimensional RF pulse performance and to shorten the pulse duration. Transmit SENSE is usually applied to improve spatially selective RF pulses in two or three dimensions.

The high RF excitation power results in high Specific Absorption Rate (SAR) in patient body, which increases tissue heating during magnetic resonance imaging. A reduction of RF power applied during MR scanning would be advantageous to reduce RF amplifier costs. Also, a reduction of local/global SAR is important for RF patient safety and temporal scan performance.

SUMMARY OF THE INVENTION

Embodiments of the invention may provide for a method for generating a slice-/or slab-selective spatial radio frequency RF excitation magnetic field, a magnetic resonance imaging system and a computer program product.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

Magnetic resonance image data is defined herein as being the recorded measurements of radio frequency signals emitted by atomic spins in the patient excited by the antenna(s) of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

The term "FDTD" stands for finite-difference time-domain.

In one aspect, the invention relates to a magnetic resonance imaging MRI system for acquiring magnetic resonance data from a target volume in a subject. The magnetic resonance imaging system comprises a plurality of excitation means for generating a slice-/or slab-selective spatial radio frequency RF excitation magnetic field targeting slice/slab spatial variations in the target volume.

The term slab will be used throughout the disclosure to designate either a slice or a slab. The slab plane in the target volume may be first selected. This may be done by exciting the magnetic spins in the slice plane of the target volume by a coincident combination of a gradient magnetic field and a slice selective RF pulse at a specific Larmor frequency. The gradient magnetic field is applied perpendicular to the slab plane which is added to the main static magnetic field $B_0$. Preferably, the plurality of excitation means comprises an RF coil antennae.

The MRI system further comprises a controller coupled to the plurality of excitation means, wherein the controller is adapted for determining a power level required by the plurality of excitation means for generating the slice-/or slab-selective spatial RF excitation magnetic field. Each of the plurality of excitation means may be associated with its own time-dependent waveform, which is generated at certain power level. The power level may be, but is not limited to, an integration of the individual power level required by each one of the waveforms.

The controller is further adapted for decomposing the slice-/or slab-selective spatial RF excitation magnetic field into respective RF excitation constituents of the plurality of excitation means. This defines for each excitation means a time-dependent waveform, wherein transmitting these waveforms simultaneously via corresponding excitation mean excites the magnetic spins in the selected slab plane. This may be advantageous as it requires less time to achieve the RF-excitation, and thus, shortens the duration of multi-dimensional RF pulses while maintaining the spatial resolution. The RF excitation constituents contribute to the k-space trajectories simultaneously. The computation of the RF excitation constituents employs a matrix inversion method.

The controller is further adapted for controlling each of the plurality of excitation means to simultaneously generate the respective RF excitation constituent, using the determined power level for acquiring the magnetic resonance data.

Said features may be advantageous in that they provide only the required power for the excitation of the desired/selected slab plane. For example, in case of two excitation means, the RF power required for exciting the slab plane may decrease down to ~25% below the RF power required by the basic RF shimming of e.g. standard Transmit SENSE. The power consumption is reduced because the RF pulses excite only part of the slab with high sensitivity in each individual excitation means using individually tailored RF waveforms for each excitation means. Also, a lower required RF power leads to a lower electricity consumption, and since the RF power required for the power amplifier is the major contributor of the total energy consumption, the saving in energy cost is significant.

Another advantage may be that the slab-selective RF pulses may have the same length as standard slice-selection pulses and may therefore easily be incorporated in standard sequences without requiring change of the programmable sequence parameters such as echo delay time (TE) or repetition time (TR). Also, the selection gradient is the same as for standard imaging. In contrast to standard Transmit SENSE (using 2D-selective spatial RF pulses), no acceleration of the RF pulses is required. RF pulse duration may be kept constant to ease also implementation in standard MR. The ability of this method to lower the RF power consumption or to improve the slice profile increases with the through-plane variation of the sensitivity profiles of the Tx array elements. Thus, the method shows highest effects for the excitation of thick slabs (as applied in REST or 3D imaging) where through-plane B1 homogeneity is of special concern.

According to one embodiment, the determining of the power level required by the excitation means comprises: receiving data indicative of the power level, the power level being estimated using an RF simulation based on a model of the plurality of excitation means for applying the slice-/or slab-selective spatial radio frequency RF excitation magnetic field on a model of the subject. This may be advantageous, in that it may provide an estimation of the effective amount of the power required to excite the slab plane. It also prevents the subject or the patient from an excessive heating that would be caused by an experimental test involving high power.

According to one embodiment, the determining of the power level required by the plurality of excitation means comprises: controlling the MRI system to acquire pre-scan data from a pre-scan of the subject using the slice-selective spatial RF excitation magnetic field and using the pre-scan data to determine the power level. This may be advantageous, because it may provide a precise estimation of the RF power required by the system to generate the slab-selective spatial radio frequency RF excitation magnetic field.

The power level required by the plurality of excitations means may also be determined from empirical data obtained by the same MRI system at a previous time.

According to one embodiment, the controller is further adapted for calculating a specific absorption rate SAR value associated with the slice-selective RF excitation magnetic field, wherein controlling each of the plurality of excitation means comprises controlling each of the plurality of excitation means to simultaneously generate the respective RF excitation constituent if the SAR value is below a predetermined SAR level. In order to avoid excessive patient heating, the specific absorption rate (SAR) associated with the RF excitation has to be kept below certain limits. The effective control of the SAR can be reached by the use of slab-selective RF excitation because it allows for a minimal SAR i.e. the predetermined SAR level that cannot be reached by the standard Transmit SENSE excitation pulses.

According to one embodiment, the magnetic resonance imaging system further comprises an RF amplifier for supplying current to each of the plurality of excitation means. However, it will be apparent to those skilled in the art that a plurality of RF amplifiers each coupled to a corresponding excitation mean for driving currents in the excitation means may also be used. The RF amplifier output being connected to each excitation means, and an electrical power supply coupled to the RF amplifier to supply a voltage at a first level in accordance with the determined power level to the RF amplifier output to generate a current in the excitation means to emit the slice-selective spatial RF excitation.

According to one embodiment, the controller is further adapted for controlling generating a two-dimensional spatial selective RF excitation targeting two-dimensional spatial variations in the target volume, and controlling the electrical power supply to adjust the voltage to a second level required for generating the two-dimensional spatial selective RF excitation.

According to one embodiment, the controller if further adapted for controlling generating a three-dimensional spatial selective RF excitation targeting three-dimensional spatial variations in the target volume, controlling the electrical power supply to adjust the voltage to a third level required for generating the three-dimensional spatial selective RF excitation.

These embodiments may permit switching between different (i.e. number of dimensions of the variations of the spatial B1 distribution differ) spatial selective RF excitations while maintaining the voltage input to a required level for the spatial selective RF excitation currently in use.

The voltage at third level is higher than the voltage at second level while the voltage at second level is higher than the voltage at first level.

According to one embodiment, the controller is an add-on module to the electrical power supply and/or the RF amplifier.

According to one embodiment, the determining of the power level required by the plurality of excitation means comprises determining the power level as a sum of the individual power levels required by each of the plurality of excitation means for generating the respective RF excitation constituent.

For example, one may consider the case of parallel excitation with R transmit coils, each of which is driven by an independent RF pulse waveform $b_r(t)$. Neglecting interactions between the R coils, the power level may be defined as follows:

$$P_{ower} = \sum_{r \leq R} \int_{t \leq T} b_r^2(t)\,dt$$

where T is the RF pulse duration.

According to one embodiment, the plurality of excitation means comprises a transmit array coil comprising a plurality of RF transmit coils. The RF transmit coil may be for example a birdcage, a TEM and/or a surface coil.

In another aspect, the invention relates to a method for acquiring magnetic resonance data, by a MRI system, from a target volume in a subject, the method comprising:
  generating by a plurality of excitation means a slice-/or slab-selective spatial radio frequency RF excitation magnetic field targeting slice/slab spatial variations in the target volume,
  determining by a controller a power level required by the plurality of excitation means for generating the slice-/or slab-selective spatial RF excitation magnetic field,
  decomposing by the controller the slice-/or slab-selective spatial RF excitation magnetic field into respective RF excitation constituents of the plurality of excitation means,
  controlling by the controller each of the plurality of excitation means to simultaneously generate the respective RF excitation constituent, using the determined power level for acquiring the magnetic resonance data.

In another aspect, the invention relates to a computer program product comprising computer executable instructions to perform the method steps of the method described above.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
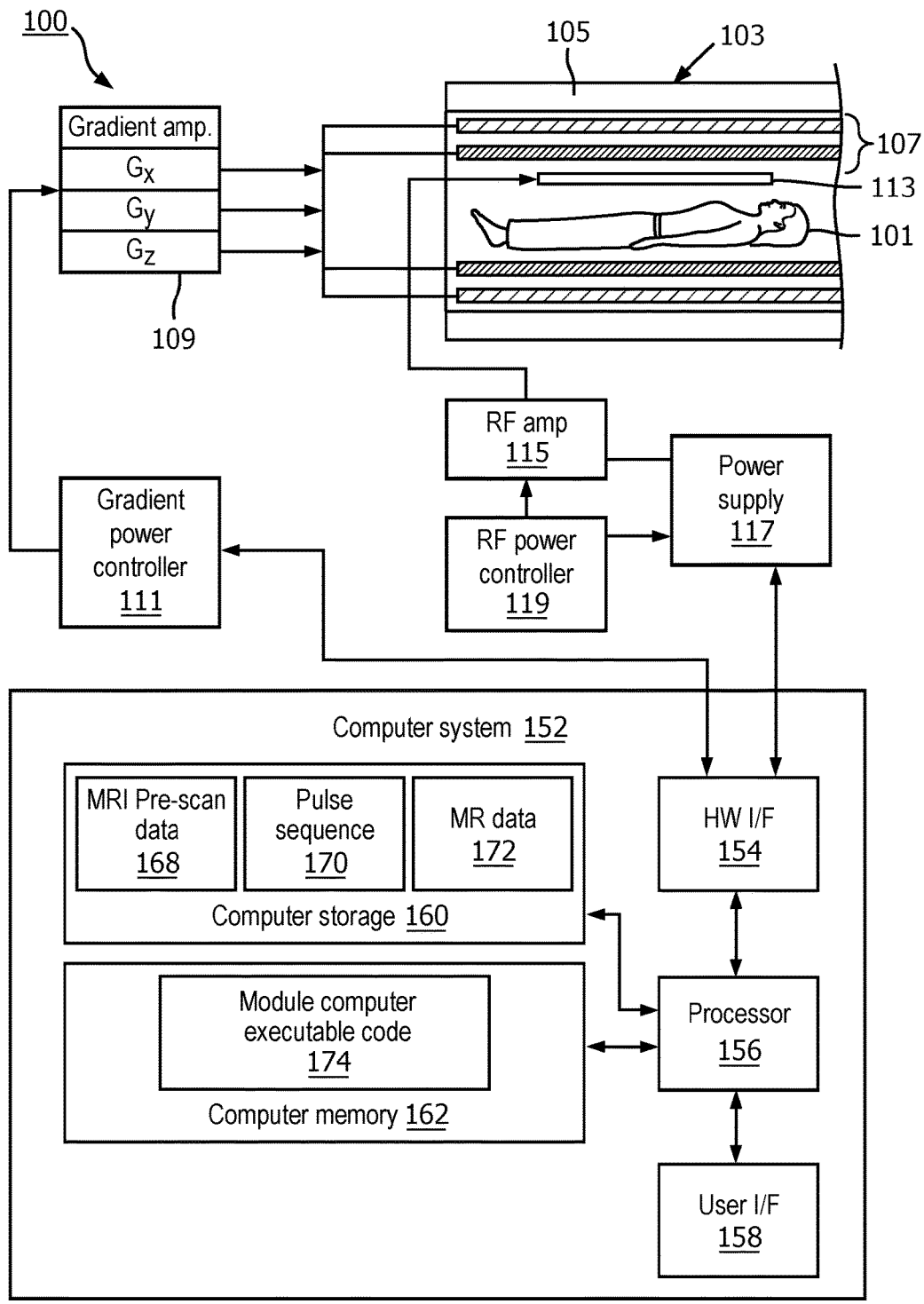
FIG. 1 shows a cross-sectional and functional view of a medical apparatus.

FIG. 1 illustrates an exemplary magnetic resonance imaging (MRI) system 100 for generating images of a patient 101. MRI system 100 comprises magnetic assembly 103 to generate magnetic fields that will be applied to patient 101. Magnetic assembly 103 comprises magnet coils 105 adapted to produce a static magnetic field required to perform magnetic resonance imaging and gradient coils 107. The gradient coils 107 are made up of an X-axis gradient coil, Y-axis gradient coil, and Z-axis gradient coil. This enables to image different regions of the patient 101 using the magnetic gradient field being produced by the gradient coils.

MRI system 100 further comprises a gradient amplifier unit 109, and a gradient power controller 111. The gradient amplifier unit 109 includes an X-axis gradient amplifier Gx, Y-axis gradient amplifier Gy, and Z-axis gradient amplifier Gz. The gradient coil 107 is connected with the gradient amplifier 109. The X-axis gradient coil, Y-axis gradient coil, and Z-axis gradient coil of the gradient coil 107 are connected, respectively, with the Gx amplifier, Gy amplifier and Gz amplifier of the gradient amplifier 109. The gradient fields serve to spatially encode the magnetic resonance signals and to span the RF-energy during RF excitation across k-space.

The gradient power controller 111 is connected with the gradient amplifier 109. Gradient power controller 111 generates control signals for controlling the gradient amplifier. In particular, gradient power controller 111 may generate control signals that induce gradient amplifier unit 109 to energize gradient coils 107.

MRI system 100 further comprises an RF transmit coil 113 above the patient 101 for generating the RF excitation pulses. The excitation means 113 include a set of surface coils. The excitation means 113 may be used alternately for transmission of RF pulses as well as for reception of magnetic resonance signals. The RF transmit coil 113 may be implemented as a transmit array coil comprising a plurality of RF transmit coils. The RF transmit coil 113 is connected to an RF amplifier 115. The RF amplifier 115 may be powered by an electrical power supply 117. The electrical power supply 117 supplies a voltage for the RF amplifier 115 to generate a current in the RF transmit coil 113 to produce RF excitation pulses. A RF power controller 119 controls the RF amplifier 115 and the electrical power supply 117.

The gradient power controller 111 and RF power controller 119 are shown as being connected to a hardware interface 154 of a computer system 152. The computer system 152 uses a processor 156 to control the magnetic resonance imaging system 100.

The computer system 152 shown in FIG. 1 is illustrative. Multiple processors and computer systems may be used to represent the functionality illustrated by this single computer system 152. The computer system 152 comprises the hardware interface 154 which allows the processor 156 to send and receive messages to components of the MRI system 100. The processor 156 is also connected to a user interface 158, computer storage 160, and computer memory 162.

The computer storage 160 is shown as containing MRI pre-scan data 168. The pre-scan data is indicative of the required power level by the RF transmit coil array for generating a slice-/or slab-selective spatial RF excitation magnetic field. The RF power controller 119 may read the pre-scan data 168 from computer storage 160 and determine the a power level required by the excitation means for generating the slab-selective spatial RF excitation magnetic field.

The computer storage 160 is further shown as containing a pulse sequence 170. The pulse sequence 170 either contains instructions or it contains a timeline which may be used for constructing instructions which enable the magnetic resonance imaging system 100 to acquire magnetic resonance data 172.

The computer storage 160 is further shown as storing magnetic resonance data 172 acquired by the magnetic resonance imaging system 100.

The computer memory 162 is shown as containing a module 174. The module 174 contains computer-executable code which enables the processor 156 to control the operation and function of the MRI system 100. For example the module 174 may use the pulse sequence 170 to acquire the magnetic resonance data 172.

Figure 2:
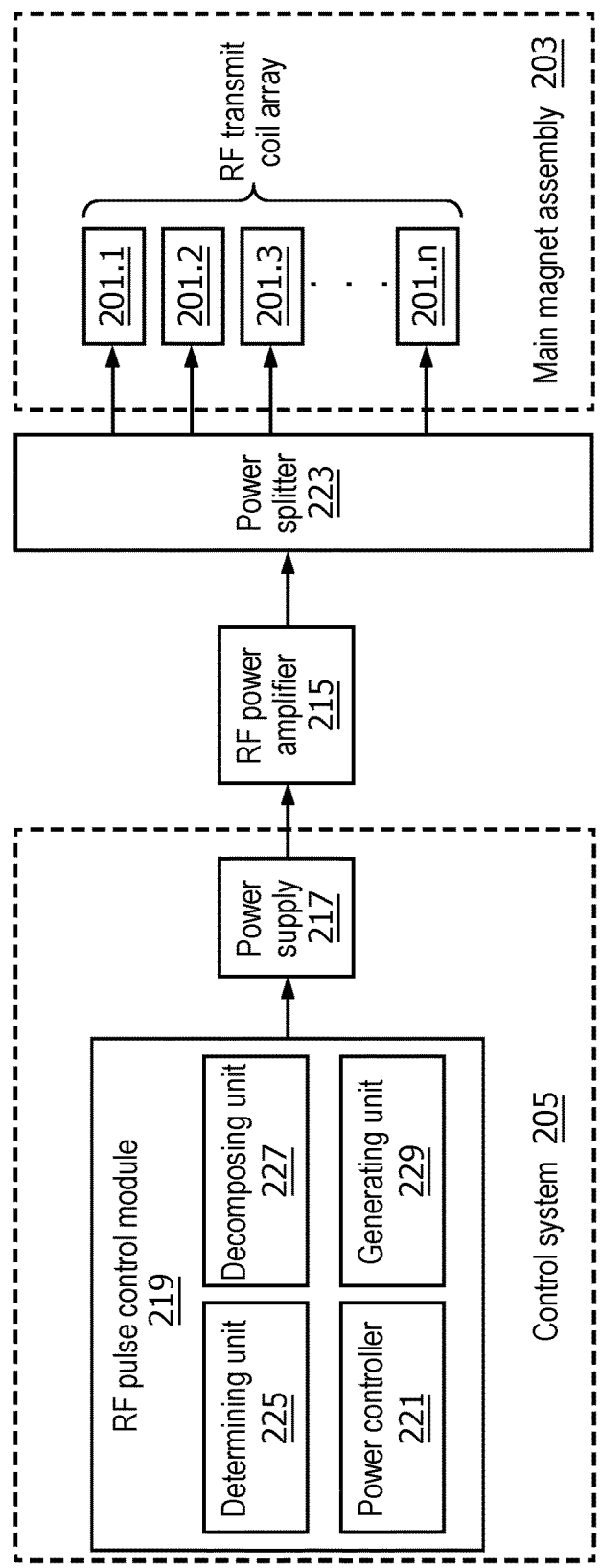
FIG. 2 shows a radio frequency transmit system.

For the purpose of explanation, the system described in FIG. 2 can be implemented in the MRI system in FIG. 1, but is not limited to this implementation. Therefore, reference numerals from FIG. 1 are not necessarily used in FIG. 2.

FIG. 2 shows an RF transmit system. The RF transmit system comprises a plurality of separate RF transmit coils 201 which are situated within main magnet assembly 203.

The RF transmit system 100 exercises control over the RF transmit coils 201 by means of the control system 205 and the RF power amplifier 215. The control system 205 comprises an RF pulse control module 219 and an electrical power supply 217 which is controlled by a power controller 221 of the RF pulse control module 219. The RF pulse control module 219 is arranged to perform the various functions involved with the RF excitations.

The RF pulse control module 219 uses control signals generated by a computer (not shown) to produce the RF excitation field Bi through power amplifier 215 at a transmit coil i (e.g. 201.1) which emits the Bi field in a target volume of the patient 101. The RF pulse control module 219 comprises a determining unit 225 for determining a power level required by the excitation means for generating a slab-selective spatial RF excitation magnetic field. The RF pulse control module 219 further comprises a decomposing unit 227 for decomposing the slab-selective spatial RF excitation magnetic field into respective RF excitation constituents (Bi) of the excitation means, and a generating unit 229 for controlling each of the excitation means to simultaneously generate the respective RF excitation constituent, using the determined power level for acquiring the magnetic resonance data.

The power rating of the RF power amplifier 215 may depend on the type of spatial-selective RF excitation magnetic field being used by the RF transmit system. The spatial-selective RF excitation magnetic field comprises a slab-selective RF excitation magnetic field and/or 2D/3D-selective RF excitation magnetic field. Depending on the type of the excitation, the power controller 221 may control the electrical power supply 217 to supply a voltage at a level corresponding with the required power by the excitation. For example, the RF power required by a slab-selective RF excitation magnetic field may decrease down to about 0.25% below the RF power required by basic RF shimming (i.e., optimizing amplitude and phase of each Tx channel), and thus the level of the required voltage may be below the standard level.

The RF power amplifier 215 may energize RF coils 201 via the power splitter 223. The power splitter 223 is used for dividing the RF power applied by the RF power amplifier 215 among the RF transmit coils 201 in accordance with RF excitation field Bi of each transmit coil i (e.g. 201.2). In some cases, the ensemble of RF amplifier 215 and power splitter 223 is replaced by an ensemble for separate RF amplifiers 215.1, 215.2, . . . 215.N, thus superseding the power splitter 223 and facilitating independent waveforms for the N different Tx channels.

Figure 3:
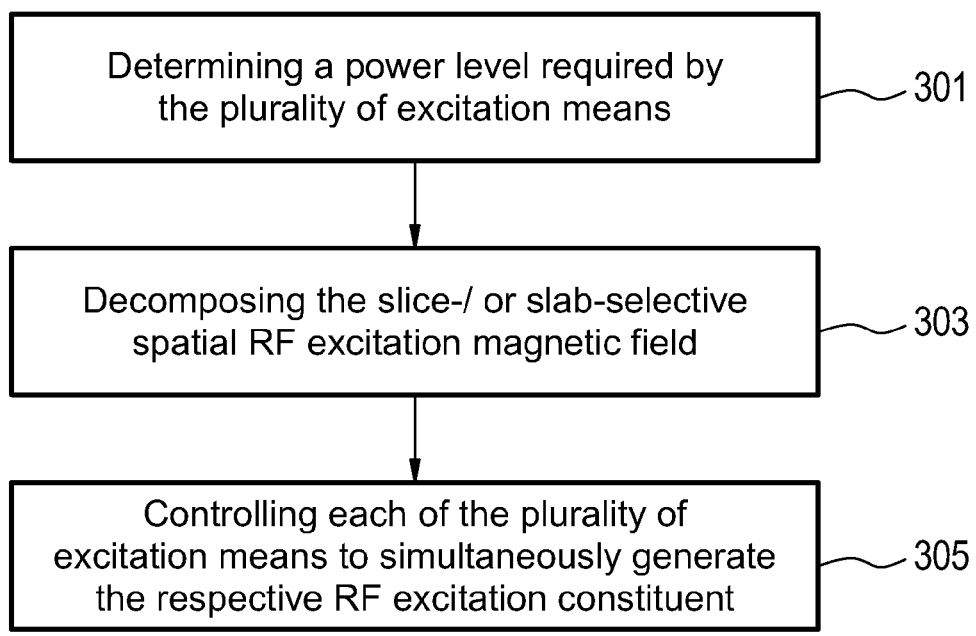
FIG. 3 is a flowchart of a method for generating a slice-/or slab-selective spatial radio frequency RF excitation magnetic field.

FIG. 3 is a flowchart of a method for supplying current to a RF Tx coil of a magnetic resonance imaging system by a RF amplifier.

In step 301, the controller determines a power level required by the excitation means for generating the slice-/or slab-selective spatial RF excitation magnetic field. The power level required by the excitation means is determined after receiving data indicative of the power level. The power level is estimated using an RF simulation based on a model of the excitation means for applying the slab-selective spatial radio frequency RF excitation magnetic field on a model of the patient 101. In another example, this power level may be determined by first acquiring by an MRI system pre-scan data from a pre-scan of the subject using the slice-selective spatial RF excitation magnetic field and then using the pre-scan data to determine the power level.

In step 303, the controller decomposes the slab-selective spatial RF excitation magnetic field into respective RF excitation constituents of the excitation means.

In step 305 the controller controls each of the excitation means to simultaneously generate the respective RF excitation constituent, using the determined power level for acquiring the magnetic resonance data.

The slab-selective RF excitations constituents i.e. Bi of each transmit coil and their simultaneous emission, which defines a 1D Transmit SENSE are described in details in the following paragraphs.

The general 3D equation of Transmit SENSE for N independent Tx elements of an array transmit coil which defines a linear superposition of individual pulse profiles is:

$$P_{des}(r) = \sum_{n \leq N} S_n(r) P_n(r) \quad (1)$$

with $P_{des}$ is the desired target pattern, $S_n$ the spatial RF-emission profile of Tx element n, and $P_n$ the spatial excitation pattern of Tx element n. Eq. (1) is applied to the through-plane direction assumed to be along z $$P_{des}(z) = \sum_{n \leq N} S_n(z) P_n(z). \quad (2)$$

After transformation into k-space ($z \rightarrow k_z$), discretization of the time coordinate of the k-space trajectories ($k_z(t) \rightarrow k_z(t_k)$) on $k \leq K$ time steps, and summarizing $\underline{s}_n(k_z)$ and $\underline{p}_n(k_z)$ to $\underline{s}_{full}(k_z)$ and $\underline{p}_{full}(k_z)$ (as described in U. Katscher et al., MRM 49 (2003) 144-150), respectively, Eq. (2) can be solved by, e.g., regularized pseudo-inversion $$\underline{p}_{full}(k_z(t_k)) = (\underline{s}_{full}^H \underline{s}_{full} + \lambda)^{-1} \underline{s}_{full}^H \underline{p}_{des}(k_z(t_k)). \quad (3)$$

This equation can be used to shorten the duration of the individual pulses (reducing K), which however yields only a negligible effect. Furthermore, the equation is able to slightly reduce the normalized root-mean-square error (NRMSE) between desired and obtained excitation pattern $P_{des}$. However, the strongest effect of Eq. (3) is observed reducing the total RF power $$P_{tot} = \sum_{k \leq K} \underline{p}_{full}^2(k_z(t_k)). \quad (4)$$

Similarly, a reduction of the local or global SAR can be achieved if an appropriate SAR model is included in Eqs. 3 and 4. A trade-off between $P_{tot}$ and NRMSE between desired and obtained excitation pattern is achieved by the regularization parameter λ in Eq. (3). This freedom can be applied to achieve a better performance where the slab profile is critical (e.g. in 3D imaging) or to emphasize power/SAR reduction (e.g. for REST slabs).

Simulations

Two following simulations demonstrate the feasibility of the present subject matter: a two-channel scenario with synthetic, linear sensitivity profiles, and an eight-channel scenario with simulated sensitivities of the transverse cross-section of an arm. In both scenarios, a constant target profile in the excited slab ($P_{des}$=const) was chosen for "tailored" RF shimming.

Figure 4:
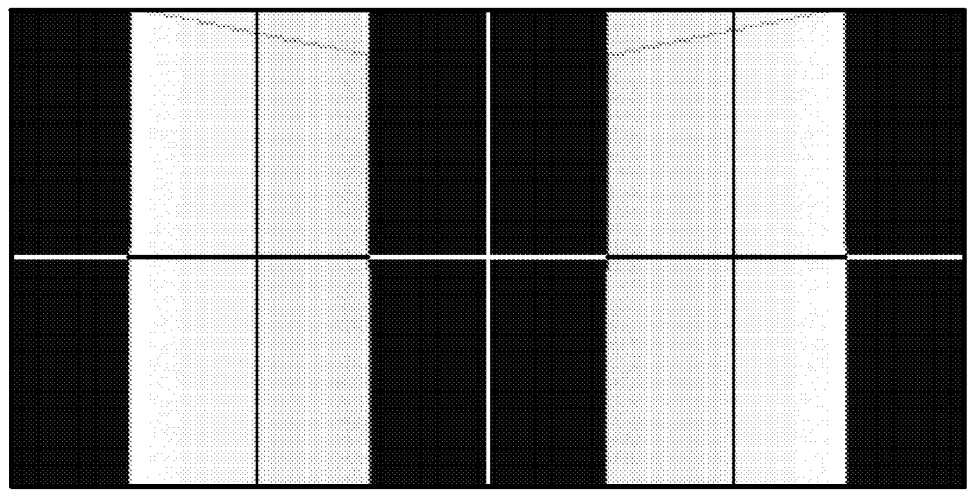
FIG. 4 shows two linear sensitivity profiles for two different through plane variations.
Figure 4:
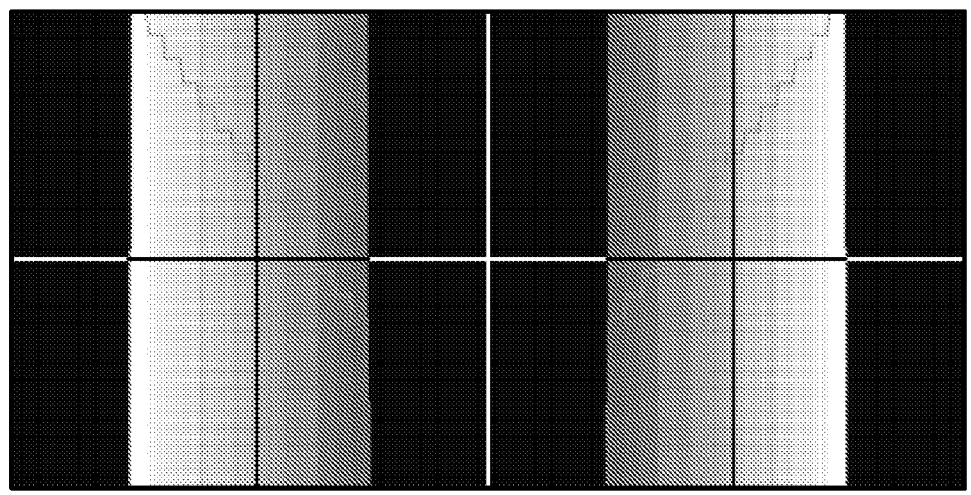
Figure 5:
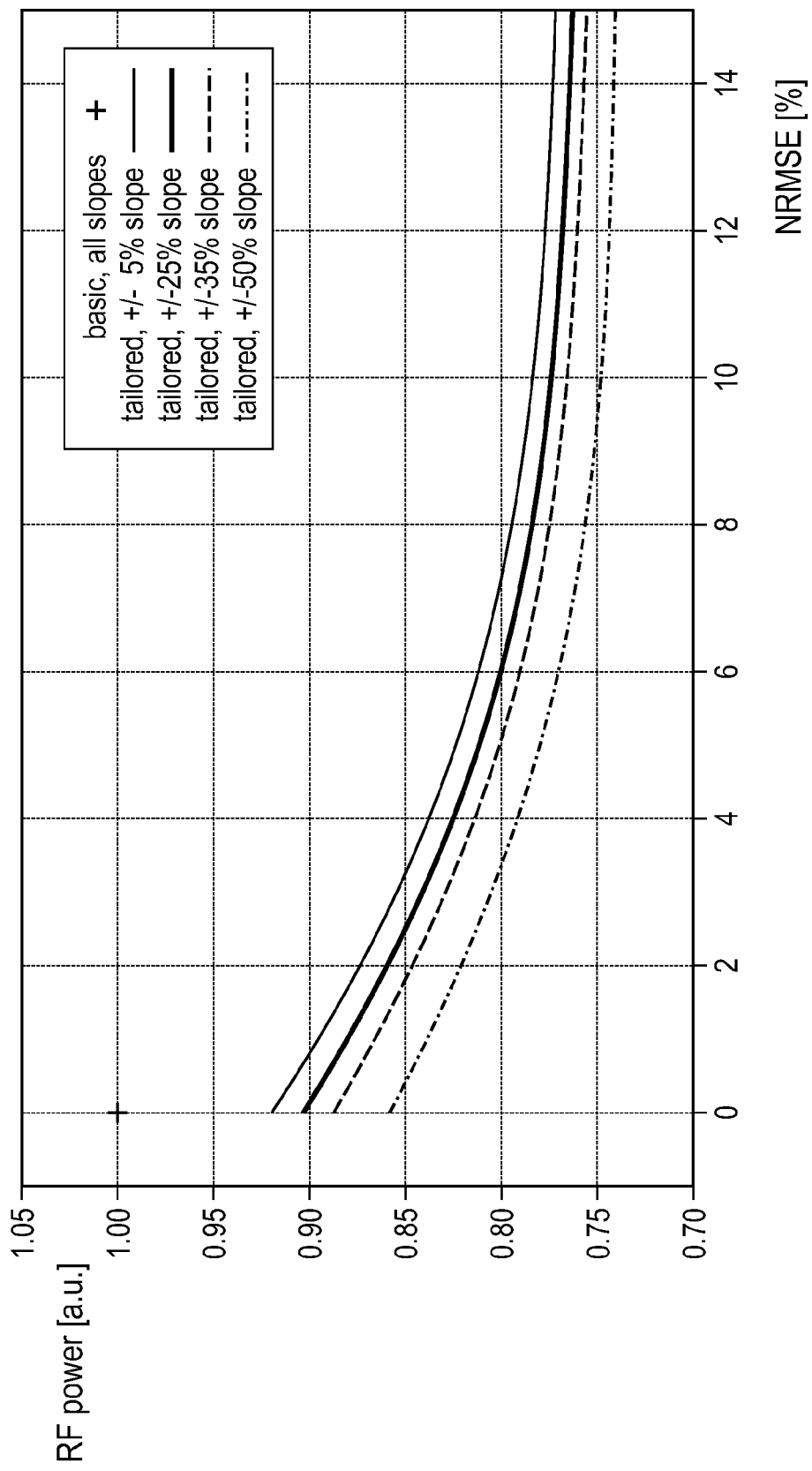
FIG. 5 shows a distribution of the RF power and normalized root mean square for the two-channel scenario.

Two Channel Scenario:

The two linear sensitivities are shown in FIG. 4 for two different through-plane variations (sensitivity slopes) of ±5% and ±50%. The trade-off between $P_{tot}$ and NRMSE using different λ in Eq. (3) is shown in FIG. 5. The two linear sensitivities allow NRMSE=0 for all possible slopes. Depending on this slope, the required RF power is ~10% below the RF power required for "basic" RF shimming, means the optimal choice of the amplitude and phase in each individual transmit channel, using standard slice-selective excitation. Allowing NRMSE>0, the RF power further decreases down to ~25% below basic RF shimming. The power reduction arises from the ability of the RF pulses to excite only the part of the slab with high sensitivity in each individual Tx channel using individually tailored RF waveforms for each channel.

Figure 6:
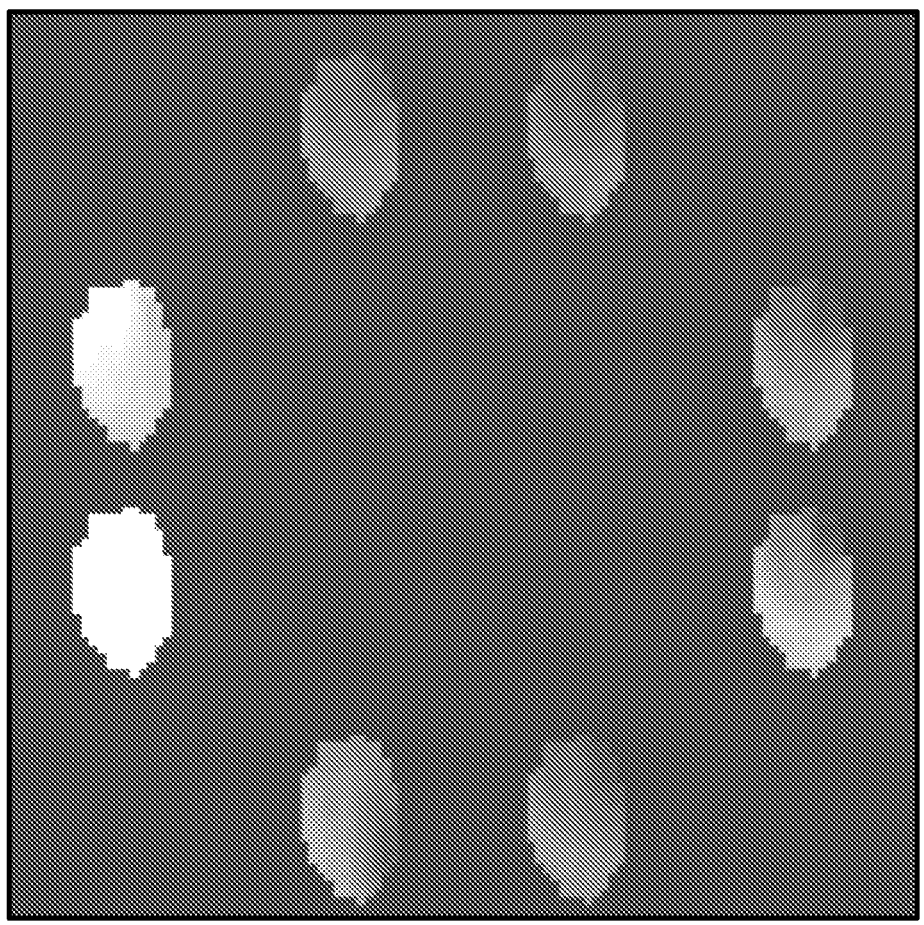
FIG. 6 shows eight FDTD-simulated sensitivities of the transverse cross-section of an arm.
Figure 7:
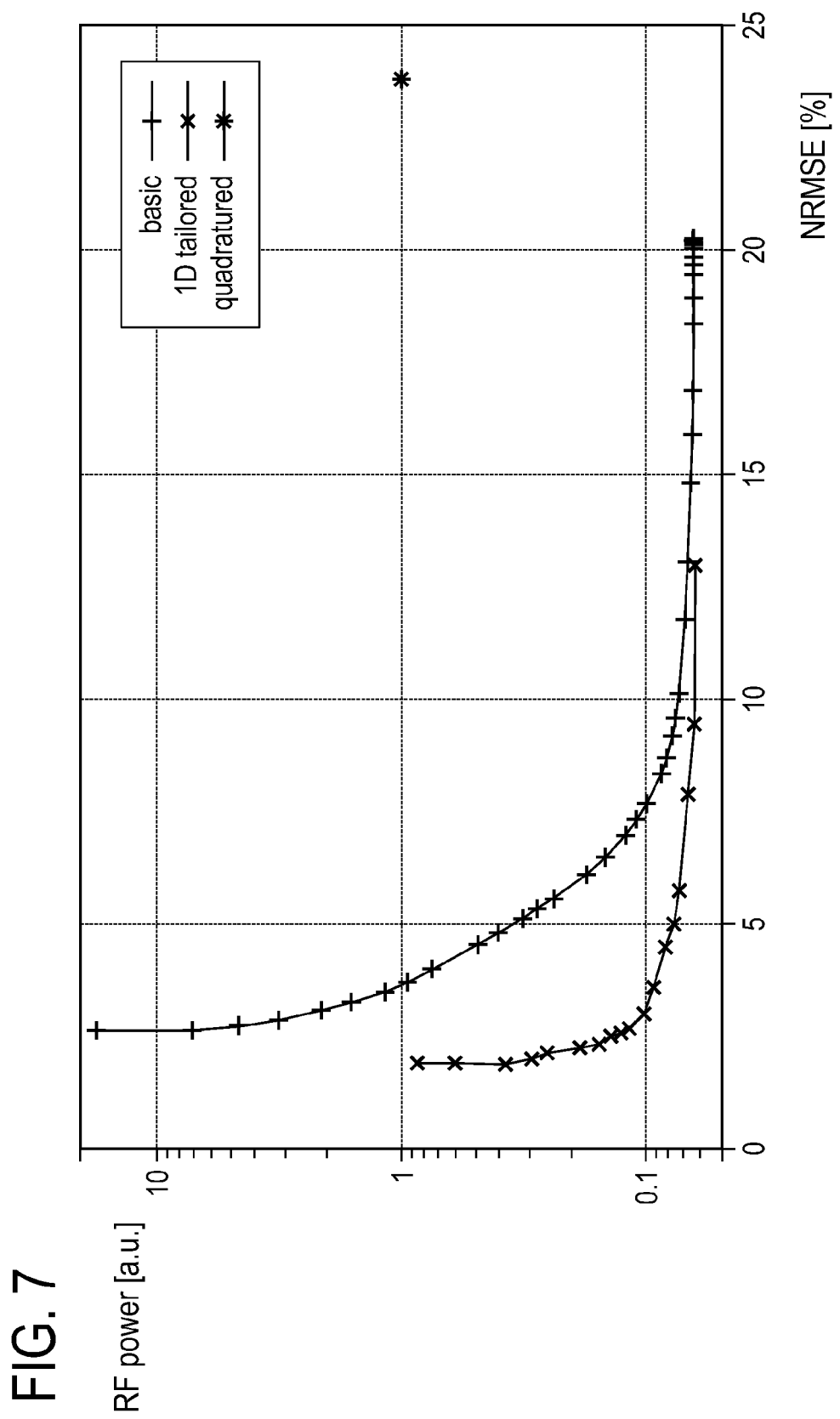
FIG. 7 shows a distribution of the RF power and normalized root mean square for the eight-channel scenario.

Eight Channel Scenario:

The eight FDTD-simulated sensitivities of the transverse cross-section of an arm are shown in FIG. 6. In this case, the proposed method improves the optimum B1 homogeneity from NRMSE=2.6% for basic RF shimming (amplitude and phase optimised) to NRMSE=1.9% (FIG. 7). More important, for a given NRMSE, the required RF power is up to a factor 10 lower for the proposed 1D tailored shimming compared with basic shimming. For large λ (i.e., large NRMSE), $P_{tot}$ is the same for both methods. As expected, both methods outperform quadrature excitation, also shown in FIG. 7.

One Channel Scenario

Using a single Tx channel, the described method is still able to improve the homogeneity of the excited slice/slab, particularly if the sensitivity change inside the slice/slab is in first order oriented perpendicular to the slice/slab.

LIST OF REFERENCE NUMERALS

100 MRI system
101 patient
103 magnetic assembly
105 magnet coil
107 gradient coil
109 gradient amplifier
111 gradient power controller
113 RF coil
117 electrical power supply
119 RF power controller
152 computer system
154 hardware interface
156 processor
158 user interface
160 computer storage
162 computer memory
168 pre-scan data
170 pulse sequence
172 magnetic resonance data
174 module
200 RF transmit system
201 RF coils
203 magnet system
205 control system
215 RF power amplifier
217 electrical power supply
219 RF power controller
221 power controller
223 power splitter
225 determining unit
227 decomposing unit
229 generating unit

The invention claimed is:

1. A magnetic resonance imaging (MRI) system for acquiring magnetic resonance data from a target volume in a subject, the magnetic resonance imaging system comprising:
a plurality of excitation means for generating a-slice-selective or slab-selective spatial radio frequency (RF) excitation magnetic field targeting only slice/slab spatial variations in the target volume, and
a controller coupled to the plurality of excitation means, wherein the controller is adapted to control a process comprising:
  determining a power level that the plurality of excitation means require to generate the slice-selective or slab-selective spatial RF excitation magnetic field for exciting the selected slice or slab,
  wherein the determining of the power level required by the plurality of excitation means comprises:
    controlling the MRI system to acquire pre-scan data from a pre-scan of the subject using the slice-selective spatial RF excitation magnetic field and using the pre-scan data to determine the power level;
  decomposing the slice-selective or slab-selective spatial RF
  excitation magnetic field into respective RF excitation constituents of the plurality of excitation means, and
  controlling each of the plurality of excitation means to simultaneously generate the respective RF excitation constituent, using the determined power-level to generate the slice-selective or slab-selective spatial RF excitation magnetic field, wherein the slice-selective or slab-selective spatial RF excitation magnetic field is applied to the selected slice or slab, and the magnetic resonance data is acquired.

2. The magnetic resonance imaging system of claim 1, wherein the determining of the power level required by the plurality of excitation means comprises: receiving data indicative of the power level, the power level being estimated using an RF simulation based on a model of the excitation means for applying the slice-selective or slab-selective spatial radio frequency RF excitation magnetic field on a model of the subject.

3. The magnetic resonance imaging system of claim 1, wherein the controller is further adapted for calculating a specific absorption rate (SAR) value associated with the slice-selective RF excitation magnetic field, wherein controlling each of the plurality of excitation means comprises controlling each of the plurality of excitation means to simultaneously generate the respective RF excitation constituent if the SAR value is below a predetermined SAR level.

4. The magnetic resonance imaging system of claim 1, further comprising:
an RF amplifier for supplying current to each of the plurality of excitation means, the RF amplifier output being connected to each excitation means, and an electrical power supply coupled to the RF amplifier to supply a voltage at a first level in accordance with the determined power level to the RF amplifier output to generate a current in the excitation means to emit the slice-selective spatial RF excitation.

5. The magnetic resonance imaging system of claim 4, wherein the controller is further adapted for:
controlling generating a two-dimensional spatial selective RF excitation targeting two-dimensional spatial variations in the target volume, and
controlling the electrical power supply to adjust the voltage to a second level required for generating the two-dimensional spatial selective RF excitation.

6. The magnetic resonance imaging system of claim 4, wherein the controller is further adapted for:
controlling generating a three-dimensional spatial selective RF excitation targeting three-dimensional spatial variations in the target volume, and
controlling the electrical power supply to adjust the voltage to a third level required for generating the three-dimensional spatial selective RF excitation.

7. The magnetic resonance imaging system of claim 4, wherein the controller is an add-on module to the electrical power supply and/or the RF amplifier.

8. The magnetic resonance imaging system of claim 1, wherein the determining of the power level required by the plurality of excitation means comprises determining the power level as a sum of the individual power levels required by each of the plurality of excitation means for generating the respective RF excitation constituent.

9. The magnetic resonance imaging system of claim 1, wherein the plurality of excitation means comprises a transmit array coil comprising a plurality of RF transmit coils.

10. A method for acquiring magnetic resonance data, by a magnetic resonance imaging (MRI) system, from a target volume in a subject, the method comprising:
  generating by a plurality of excitation means a slice-selective or slab-selective spatial radio frequency (RF) excitation magnetic field targeting only slice/slab spatial variations in the target volume;
  determining by a controller of the magnetic resonance imaging system a power level that the plurality of excitation means-require to generate the slice-selective or slab-selective spatial RF excitation magnetic field for exciting the selected slice or slab,
  wherein the determining of the power level required by the plurality of excitation means comprises:
    controlling the MRI system to acquire pre-scan data from a pre-scan of the subject using the slice-selective spatial RF excitation magnetic field and using the pre-scan data to determine the power level;
    decomposing by the controller the slice-selective or slab-selective spatial RF excitation magnetic field into respective RF excitation constituents of the plurality of excitation means, and
    controlling by the controller each of the plurality of excitation means to simultaneously generate the respective RF excitation constituent, using the determined power-level to generate the slice-selective or slab-selective spatial RF excitation magnetic field, wherein the slice-selective or slab-selective spatial RF excitation magnetic field is applied to the selected slice or slab, and the magnetic resonance data is acquired.

11. A computer-readable medium that stores computer executable instructions,
  wherein, when executed by the controller, the computer executable instructions cause the controller of the magnetic resonance imaging system to perform the determining of the power level of claim 10.

* * * * *